United States Patent [19]

Loving et al.

[11] 4,153,310

[45] May 8, 1979

[54] AIR CONDITIONING OUTDOOR SECTION CABINET CONSTRUCTION

[75] Inventors: Roderick L. Loving; Louis P. Hine, Jr., both of Norman, Okla.

[73] Assignee: Westinghouse Electric Corp., Pittsburgh, Pa.

[21] Appl. No.: 919,540

[22] Filed: Jun. 26, 1978

[51] Int. Cl.² ............................................. H05K 5/00
[52] U.S. Cl. .................... 312/100; 312/236; 174/52 R; 361/331
[58] Field of Search ............. 312/100, 236; 174/52 R; 361/331

[56] References Cited

U.S. PATENT DOCUMENTS

| | | | |
|---|---|---|---|
| 1,919,986 | 7/1933 | Powers | 312/100 |
| 2,115,720 | 5/1938 | Holmes | 312/236 |
| 2,185,562 | 1/1940 | Nielsen | 174/52 R |
| 2,538,070 | 1/1951 | Wright et al. | 361/331 |
| 2,656,948 | 10/1953 | McGee | 312/100 |
| 2,887,525 | 5/1959 | Lewus | 174/52 R |
| 3,014,158 | 12/1961 | Nelson et al. | 174/52 R |
| 3,376,086 | 4/1968 | Fisher | 312/100 |

*Primary Examiner*—Victor N. Sakran
*Attorney, Agent, or Firm*—E. C. Arenz

[57] ABSTRACT

The outdoor section cabinet construction is provided with an inside corner recess at the end of the cabinet which houses the compressor and control components, the inside corner recess being formed by two adjacent walls with a horizontal intermediate shelf defining the bottom wall of an electrical components compartment in the upper part of the recessed space, that upper part of the two walls having a multiplicity of fastener and passage openings therein which span the same area of the walls and are of the same number regardless of the height of the cabinet according to different capacity models, the multiplicity of fastener and passage openings thus accommodating all of the various sizes and types of the various components mounted in the electrical components compartment in accordance with any of the various models of outdoor section cabinets.

3 Claims, 5 Drawing Figures

AIR CONDITIONING OUTDOOR SECTION CABINET CONSTRUCTION

BACKGROUND OF THE INVENTION

1. Field of the Invention:

This invention pertains to the art of cabinet construction of outdoor section cabinets in split system air conditioning and heat pumps.

2. Description of the Prior Art:

It is known in the air conditioning art to provide an outdoor section cabinet construction in which the controls are located in that end of the compartment in which the compressor is located and to provide at least some sort of recess in the wall or walls of the unit where the valves or couplings for making refrigrant line connections are located. However, so far as we know, it was not known prior to our invention to provide an inside corner recess extending for the height of the cabinet, nor to utilize the upper part of the recess for the electrical components compartment to give easy access, nor to form the recess from a sheet which has a multiplicity of fastener and passage openings therein common to any sheet forming the recesses of any of the various size, type and capacity models.

Access to the control compartment is relatively easy by simply removing a cover enclosing the outer sides of the electrical components compartment. This avoids the problem with at least some of the prior art units in which the total top cover of the cabinet had to be removed, the top cover of some units also providing the mount for the outdoor air fan.

SUMMARY OF THE INVENTION

In accordance with the invention a cabinet of the type including an air flow section and an enclosed opposite end section has a construction in which the opposite end section includes a one-piece, vertically-disposed panel having an inside corner shape in transverse section and located at one corner of the opposite end section to form two adjacent walls of a space recessed relative to the corresponding outside corners of the top and bottom walls of the cabinet. A horizontal shelf is located at intermediate height to define the bottom wall of an electrical components compartment. At the upper part of the recessed space, a cover encloses the outer side of the electrical components compartment, the lower part of the recessed space being open and at least one wall thereof including opening means to accommodate the projection of a pair of refrigerant line fittings. The upper part of the two adjacent walls has a multiplicity of fastener and passage openings therein, the multiplicities spanning the same area of the walls and being of the same number regardless of the height of the cabinet according to the different capacity and type models to accommodate all of the various sizes and types of electrical components mounted in the electrical components compartment in accordance with the particular model.

In the preferred form, the electrical components compartment has a uniform height with the horizontal shelf located a uniform distance from the top edge of the panel regardless of the particular model with which it is associated, and the multiplicity of fastener and passage openings includes openings adapted for also mounting electrical elements on the side of the panel opposite the space defined as the electrical components compartment.

DRAWING DESCRIPTION

DESCRIPTION OF THE PREFERRED EMBODIMENT

Figure 1:
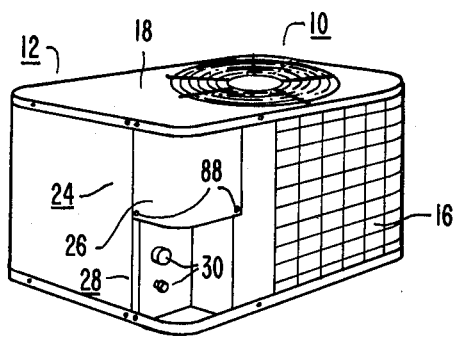
FIG. 1 is an isometric view of a typical outdoor section cabinet of one size and type in accordance with the invention.
Figure 2:
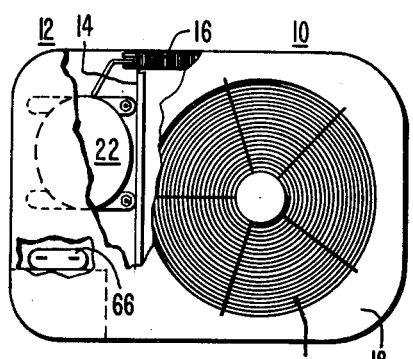
FIG. 2 is a partly broken top view of the unit of FIG. 1.

Referring to FIGS. 1 and 2, the outdoor section cabinet includes an air flow section generally designated 10 which occupies the major part of the length of the cabinet, and an enclosed opposite end section generally designated 12, with the two sections being separated by an interior vertical partition 14. As is conventional, the air flow section 10 includes a refrigerant coil 16 which extends around and basically forms the three vertical sides of the air flow section, and a fan (not shown) supported from the top wall 18 of the cabinet below the grille 20 for drawing air inwardly through the coil and discharging it upwardly.

The opposite end section 12 includes a major portion which houses the compressor 22 and connecting refrigerant lines and at its one vertical corner includes the recessed space which basically forms the subject of this invention.

The recessed space at the vertical corner includes an upper part generally designated 24 which is enclosed at its outer side by the cover 26, and a lower part generally designated 28 which is not covered and provides a recessed space which accommodates, in somewhat protected fashion, the projection of at least a pair of refrigerant fittings or valves 30 depending upon the particular type of unit.

To form the two adjacent vertical walls 32 and 34 (FIGS. 4 and 5) of the recessed space, a one-piece, vertically disposed panel is provided with an inside corner shape in transverse section. A horizontal shelf 36 is located at an intermediate height to define the bottom wall of the electrical components compartment, which corresponds to the upper part 24 of the recessed space.

Figure 4:
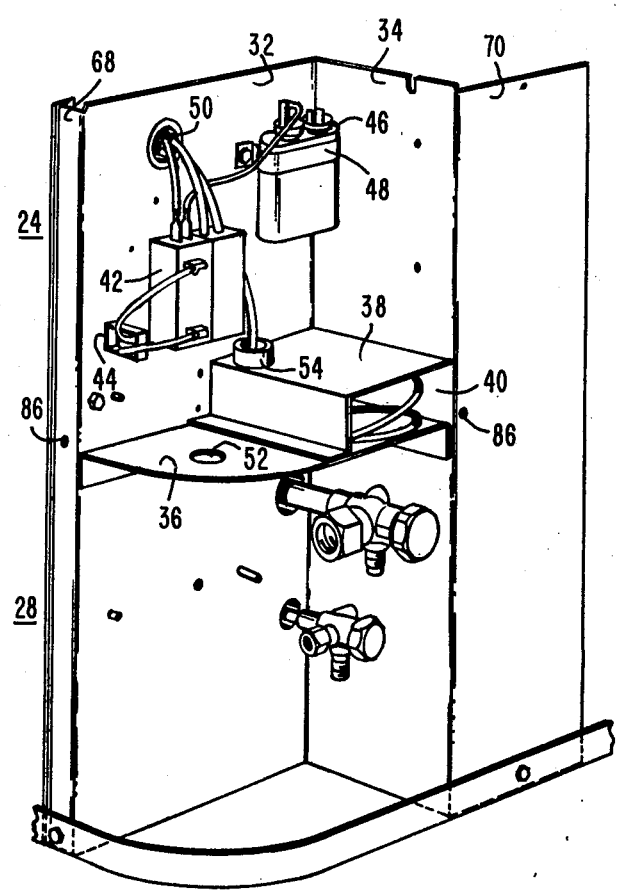
FIG. 4 is an isometric view of the corner arrangement of a cabinet of one particular size and type with a representative number of electrical components provided in the corner space.
Figure 5:
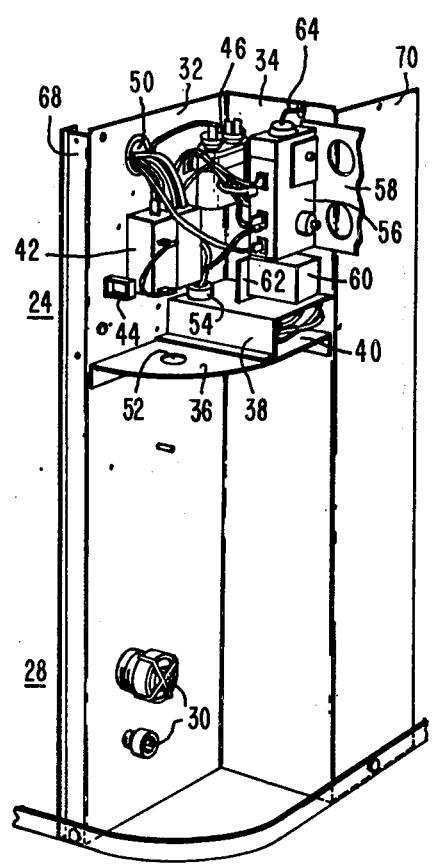
FIG. 5 is a view similar to FIG. 4 but illustrating the corner arrangement of a different size and different type of unit.

The cabinet whose corner is shown in FIG. 4 is one which is used in a 1½ ton split system air conditioner, while the cabinet whose corner is shown in FIG. 5 is one used in a 3 ton heat pump. As such, the height of the cabinet of the heat pump is significantly greater than that of the simple air conditioning unit, and the number and types of electrical components used in the heat pump unit are also different. For purposes of illustration, the main electrical components found in both of the units are shown along with some of the wiring for representative purposes. It will be apparent that the amount of wiring and number of components used in the heat pump unit of FIG. 5 is significantly greater than that of FIG. 4 for the simple air conditioner. It is emphasized that the height of the electrical components compartment 24, that is, the distance from the intermediate shelf 36 to the top edge of the panel, is the same in both cases, and that the fastener and passage openings are the same in both cases. That height is designed to accommodate the maximum number of components and wiring for the largest size and most complex unit, while the components for the smaller size simpler unit do not use the total space nor all of the openings. At least the major elements of the two control boxes will now be identified.

Referring to both FIGS. 4 and 5, a metallic barrier 38 is spot-welded to the shelf 36 to provide an underlying compartment for the field-installed, low voltage wiring whose entrance is designated 40. The compressor controller, designated by the numeral 42 in both units, is secured to the panel 32 by sheet metal screws (not shown). One wire routing clamp 44 is shown in both views adjacent the compressor controller, it being noted that in at least some units an additional routing clamp is provided on the opposite side of the compressor controller. The capacitor 46 for the outdoor fan motor is secured to the upright panel by a sheet metal strap 48 (seen only in FIG. 4), which has one end secured by a self-tapping machine screw and is hooked to an opening in the panel at the other end. The high voltage factory wiring entrance is designated 50 and the high voltage field wiring entrance provided in the shelf 36 is designated 52. A strain relief bushing 54 is provided in the barrier 38.

As is apparent from comparing FIGS. 4 and 5, considerably more electrical wiring as well as additional electrical components are provided for the heat pump unit. These extra elements include a defrost timer 56, with a flexible defrost timer cover 58 which is swung over to the face of the timer when the main cover 26 is installed, and the defrost relay 60 mounted to the relay bracket 62. The defrost timer has a cap tube 64 secured to it which passes through a notch in the panel 34.

The capacitor for the compressor motor for both of the illustrated units is mounted on the side of the panel 32 opposite the space defined as the electrical components compartment. This compressor motor capacitor 66 is shown in that position in FIG. 2.

Figure 3:
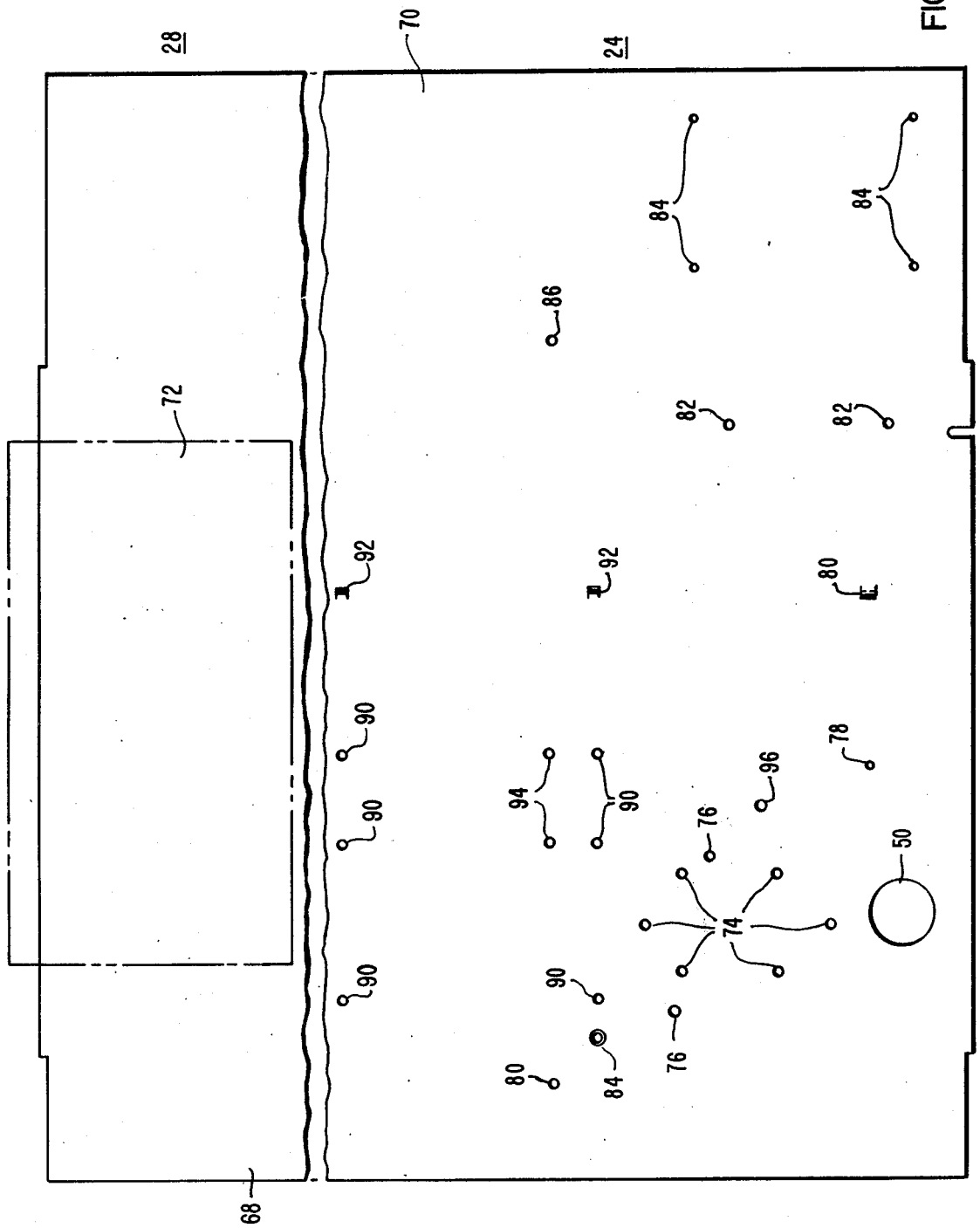
FIG. 3 is a layout view of the one-piece sheet provided with the common multiplicity of fastener and passage openings before the sheet is formed into the part which defines the corner recessed space.

FIG. 3 shows in plane form the walls 32 and 34, as well as the opposite marginal edges 68 and 70, the marginal edge 68 ultimately being formed to provide a slip joint. The view in FIG. 3 is of the back face of the sheet which forms the corner, that is, the face which is not seen in FIGS. 4 and 5, and the edge at the bottom of the drawing corresponds to the edge at the top of FIGS. 4 and 5. A single die is used to provide all of the openings and other worked areas of the upper part 24. Several different dies are required to provide the openings in the area 72, indicated by the dashed line outline since the connecting valves and fittings in the lower part of the recess corner may vary from model to model, as is apparent from FIGS. 4 and 5.

The following identifies most of the particular openings and their purpose. The opening 50 is for the factory wired high voltage entrance, while the openings 74 adjacent thereto are for securing the compressor controller. The two adjacent holes 76 are for the routing clamps. The hole 78 and tab 80 are for the fan motor capacitor mounting strap. Holes 82 to the right thereof are for mounting the defrost timer, while the holes 84 on the marginal portion 70 are for mounting the nameplate of the unit. The hole 84 adjacent the left margin 68 and at about the center level of the drawing is for mounting a ground screw 84. The holes 86 are located to receive the screws 88 (FIG. 1) which are the only screws which hold the cover 26 in place. It is noted that the top edge of the cover slips up underneath the downturned flange of the top 18 to hold the top edge of the cover in place. All of the holes 90 and the tabs 92 are provided for mounting the straps for the compressor motor capacitor 66, this number of openings being provided since the compressor motor capacitor may be mounted in different locations on the inside wall depending upon the particular model unit. The holes 94 are provided for wire ties and the hole 96 is provided for a hard start device, if used. For the most part, the remainder of the holes on the sheet and which are unidentified by number, are for the purpose of securing the panel to the sheet metal covering of the unit.

The arrangement described is such that the panel having a common multiplicity of passage openings and mounting holes in the upper part thereof may be used for at least fourteen different models of outdoor cabinets for air conditioning and heat pumps. Ready access to the electrical components compartment is had by removing the cover 26 which is held in place with only two sheet metal screws 88. The lower part of the recessed corner provides a somewhat protected space to receive the connecting valves and compatible fittings for connecting the refrigerant lines of the outdoor unit to the remainder of the system.

While the cabinet shown has rounded corners, the invention is also applicable to cabinets having square corners.

We claim:

1. In an air conditioning system outdoor section cabinet of the type including an air flow section and an enclosed opposite end section, a construction comprising:
    the opposite end section including a one-piece, vertically-disposed panel having an inside corner shape in transverse section and locate at one corner of said opposite end section to form two adjacent walls of a space recessed relative to the corresponding outside corners of the top and bottom walls of the cabinet;
    a horizontal shelf located at an intermediate height to define the bottom wall of an electrical components compartment in the upper part of said recessed space;
    a cover enclosing the outer side of said electrical components compartment;
    the lower part of said recessed space being open and one wall thereof including opening means therein to accommodate the projection of a pair of refrigerant line fittings;
    the upper part of said two adjacent walls having a multiplicity of fastener and passage openings therein, the multiplicities spanning the same area of the walls and being of the same number regardless of the height of the cabinet according to the different type and capacity models to accommodate all of the various sizes and types of electrical components mounted in said electrical components compartment in accordance with the particular model.

2. In a cabinet according to claim 1 wherein:
    said electrical components compartment has a uniform height with said horizontal shelf located a uniform distance from the top edge of said panel regardless of the particular model with which it is associated.

3. A cabinet according to claim 1 wherein:
    said multiplicity of fastener and passage openings includes openings adapted for mounting electrical elements on the side of said panel opposite the space defined as the electrical components compartment.

* * * * *